United States Patent [19]

Nakatsuka

[11] Patent Number: 5,059,975

[45] Date of Patent: Oct. 22, 1991

[54] CONTROL SIGNAL GENERATION CIRCUIT FOR WIRELESS REMOTE CONTROL SIGNAL TRANSMITTER

[75] Inventor: Shigeyuki Nakatsuka, Tokyo, Japan

[73] Assignee: NEC Corporation, Japan

[21] Appl. No.: 185,248

[22] Filed: Apr. 19, 1988

Related U.S. Application Data

[63] Continuation of Ser. No. 826,067, Feb. 4, 1986, abandoned.

[30] Foreign Application Priority Data

Feb. 5, 1985 [JP] Japan ................................. 60-20433

[51] Int. Cl.$^5$ .............................................. H04Q 9/00
[52] U.S. Cl. ................................. 341/26; 340/825.56
[58] Field of Search ........... 340/365 S, 365 R, 825.83, 340/825.76, 825.72, 825.56, 825.57; 341/26; 455/95, 603; 358/199.1

[56] References Cited

U.S. PATENT DOCUMENTS 4,271,404  6/1981  Tanaka ............................. 340/365 S
4,412,218  10/1983  Niitsu ................................. 340/365 S

OTHER PUBLICATIONS

Holt et al, "Keyboard Using Elastic Diaphram Switches", IBM Technical Disclosure Bulletin, vol. 14, No. 8, Jan. 1972, p. 2277.

Primary Examiner—Alvin E. Oberley
Attorney, Agent, or Firm—Laff, Whitesel, Conte & Saret

[57] ABSTRACT

A control signal generator is disclosed, which is used in a remote control signal transmitter for controlling the circuit operation of an instrument. The generator includes a plurality of key output terminals from which scan signals are outputted and a level detection circuit detecting a level at each key output terminal. The selected one or ones of the key output terminal are coupled to a potential source and the level detection circuit detects the level at the key output terminal during a period except for the scan signal output period, so that a plurality of kinds of custom codes each used for designating the instrument to be controlled are produced by changing the terminal coupled to the potential source and/or by increasing or decreasing its number.

15 Claims, 9 Drawing Sheets

CONTROL SIGNAL GENERATION CIRCUIT FOR WIRELESS REMOTE CONTROL SIGNAL TRANSMITTER

This application is a continuation, of application Ser. No. 06/826,067, filed 2/4/86, now abandoned.

BACKGROUND OF THE INVENTION

The present invention relates to a control signal generation circuit used in a wireless remote control signal transmitter for controlling the circuit operation of an instrument such as a television receiver, a video tape recorder, a toy, an air condisioner, etc., and more particularly to a custom code generation circuit employed in such a signal transmitter, which generates a custom code used for selecting and designating the instrument to be controlled among various ones.

A remote control signal transmitter generates a data code for controlling the operation of a controlled instrument in response to actuated or operated key or keys, wherein a semiconductor integrated circuit device (called hereinafter as an "IC") is widely used to form the data code responsive to the operated key and modulate the data code to transmit it by means of infrared rays, electromagnetic waves or supersonic waves. The remote control signal transmitter also generates a custom code in addition to the generation of the data code, the custom code being alloted to the instrument to be controlled in order that only that instrument responds to the code data. By the custom code, undesired instruments are prevented from responding to the data code.

Due to the increase in the remote-controlled instruments, a large number of custom codes should be formed. If a private remote control IC is manufactured with its peculiar custom code, its cost would be increased considerably. In order to solve this problem, it is required to generate a large number of custom codes by use of one kind remote control IC.

For this purpose, in prior art, a custom code setting terminal (called hereinafter as a "CCS" terminal) is provided to the remote control IC and key scan signals outputted from key scan output terminals are supplied selectively to the CCS terminal to obtain a custom code, as disclosed in U.S. Pat. No. 4,412,218. More specifically, the scan signals are outputted cyclically from the key scan output terminals to detect the operated key. Therefore, by coupling the selected key scan output terminal or terminals to the CCS terminal and detecting the level at the CCS terminal in synchronism with the generation timing of the scan signals, a pulse train having the combination of the data "1" and "0" is obtained. The custom code is derived from the pulse train. When the key scan output terminal or terminals coupled to the CCS terminal are changed and/or their numbers are increased or decreased, the combination of the data "1" and "0" is varied. The custom code is thus changed. Assuming that the remote control IC has eight key scan output terminals, $2^8$ (=256) kinds of the custom codes are obtained.

Thus, according to the art disclosed in the above document, various kinds of custom codes are produced by one type remote control IC which is manufactured at a low cost.

However, such a remote control IC requires a CCS terminal. An IC having a smaller number of external terminals is manufactured more cheaply, resulting in decreasing the cost of a signal transmitter. Even if a remote control IC has a large number of external terminals sufficiently to provide a CCS terminal, by replacing the CCS terminal with a key scan output terminal or a key input terminal, the number of key switches is increased, so that the remote control having various functions is carried out.

SUMMARY OF THE INVENTION

Therefore, an object of the present invention is to provide a control signal generation circuit generating a plurality of custom codes without increase in number of terminals.

Another object of the present invention is to provide a control signal generation circuit which can generate a larger number of custom codes without any increase in number of a custom code setting terminal of prior art.

A control signal generation circuit according to the present invention comprises a plurality of key output terminals coupled with a key matrix, means for generating scan signals from the key output terminals, impedance means for connecting selected one or ones of the key output terminals to a potential source, means coupled to the key output terminals for detecting a potential at each key output terminal during a period other than the scan signal generation period of the scan signal generation means, and means for producing a custom code in response to an output of the detecting means.

Thus, in the present invention, the key output terminals are also used as custom code selection terminals. The detecting means detects the potential at each key output terminal during a period other than the scan signal generation period. The selected key output terminal or terminals are coupled to the potential source. Assuming that the detection level at the terminal connected to the potential source is a logic "1" and that at the terminal non-connected to the source is a logic "0", the combination of the logics "1" and "0" is thus obtained. This combination is varied by the selection and/or the number of the key output terminal or terminals coupled to the potential source. As a result, a plurality of custom codes are derived without a custom code selection terminal which was required in the prior art.

It should be noted that the present invention does not exclude the custom code producing means utilizing the CCS terminal, but the present invention can be applied to the remote control IC with the CCS terminal. In this case, an extremely large kinds of custom codes are produced by using a remote control IC having the same terminal number as the prior art.

BRIEF DESCRIPTION OF THE DRAWINGS

The above and other objects, advantages and features of the present invention will be more apparent from the following description taken in conjunction with the accompanying drawings: in which.

DETAILED DESCRIPTION OF THE INVENTION

Figure 1:
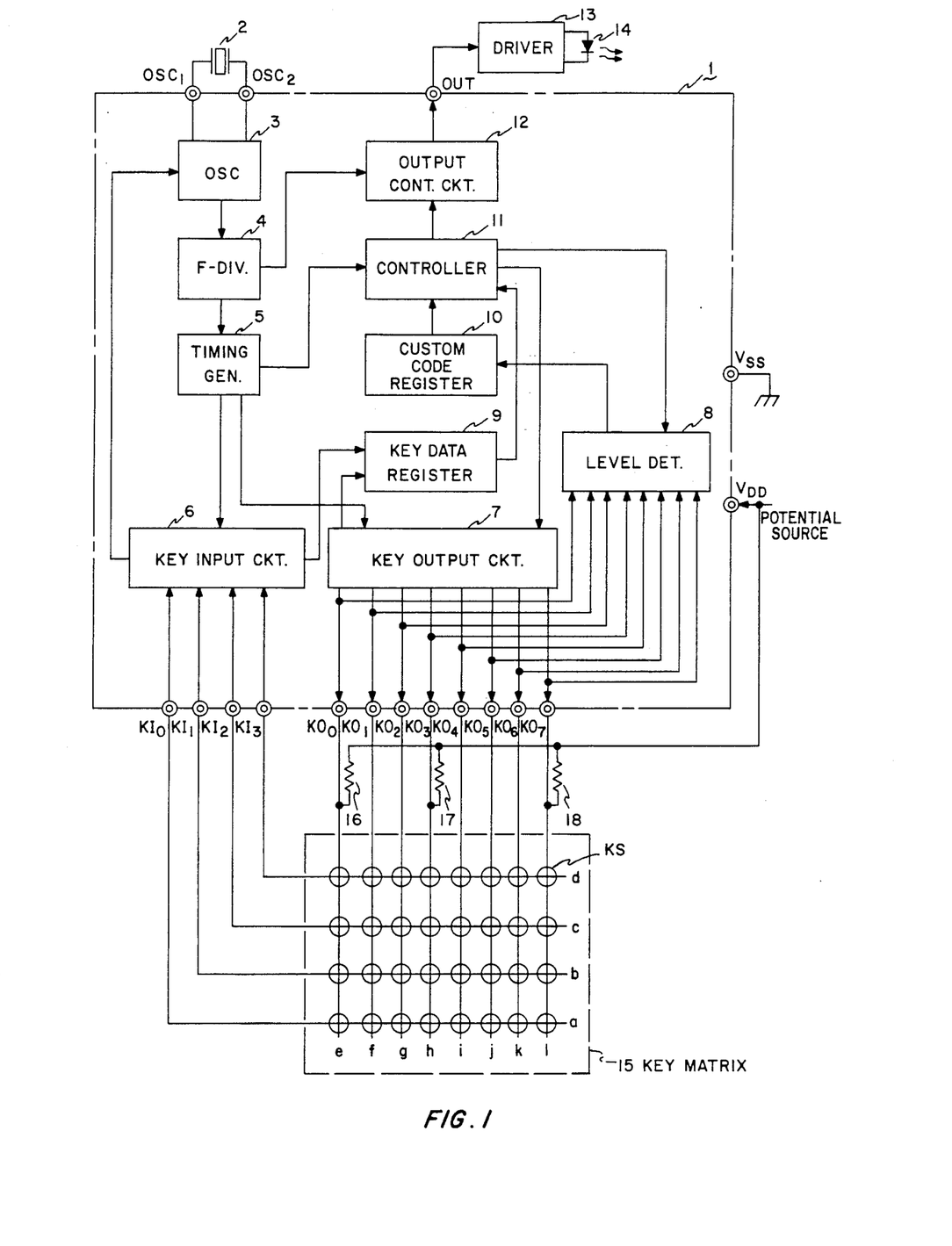
FIG. 1 is a block diagram showing a first embodiment of the present invention.

Referring to FIG. 1, a remote control signal transmitter according to a first embodiment of the present invention generates a custom code and a key data code representative of information of an operated key and outputs them as infrared rays by means of an infrared ray diode 14. The custom code and key data code are produced by a remote control IC 1 from its output terminal OUT and then supplied to a driver circuit 13 to drive the diode 14. There is provided a key matrix 15 which is used to command the change in operation of an instrument to be remote-controlled. The key matrix 15 includes four row lines a to d, eight column lines e to l, and thirty-two key switches KS disposed at the respective intersections of the row and column lines. The row lines a to d are connected to key input terminals $KI_0$ to $KI_3$ of the IC 1, respectively, and the column lines e to l are connected to key output terminals $KO_0$ to $KO_7$ of the IC 1, respectively. In order to set a custom code designating the instrument to be controlled, the selected key output terminals (in this embodiment, the first, fourth and eighth key output terminals $KO_0$, $KO_3$ and $KO_7$) are connected to a power voltage source (not shown) via resistors 16, 17 and 18, respectively. The power voltage source is also connected to a power terminal $V_{DD}$ of the IC 1. The IC 1 has another power terminal $V_{SS}$ which is in turn connected to a ground.

In a standby condition, all the key output terminals $KO_0$ to $KO_7$ of the IC 1 assume a high level. When one of the key switches KS is operated or depressed to change the circuit operation of the remote-controlled instrument, any one of the key input terminals $KI_0$ to $KI_3$ is thereby supplied with the high level. This high level is detected by a key input circuit 6, and the circuit 6 then supplies an oscillation-enable signal to an oscillator 3. The oscillator 3 thus oscillates at a frequency determined by a resonant element 2 such as a crystal or a ceramic resonator connected between terminals $OSC_1$ and $OSC_2$. The oscillation signal of the oscillator 3 is frequency-divided by a divider 4 to a predetermined frequency signal, and in response to this predetermined frequency signal a timing generator 5 supplies timing signals to the key input circuit 6, a key output circuit 7 and a controller 11. The key output circuit 7 responds to the timing signal from the timing generator 5 and a control signal from the controller 11 and outputs cyclically to the key output terminals $KO_0$ to $KO_7$ key scan signals used for detecting the operated key switch, but before this scan signal output operation, a custom code read operation is attained for reading-out the custom code alotted to the instrument to be controlled by this signal transmitter.

Figure 2:
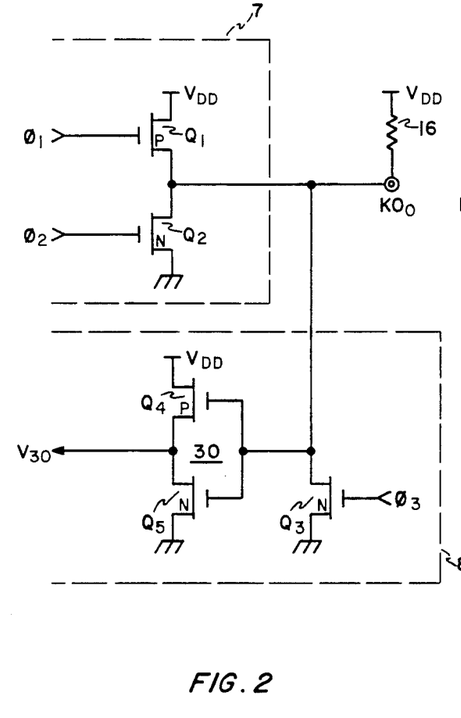
FIG. 2 is a circuit diagram showing an output stage of a key output circuit and an input stage of a level detection circuit.

For this custom code read operation, a level detection circuit 8 is provide to detect the level at each key output terminal KO. The input stage of the level detection circuit 8 as shown in FIG. 2, includes an N-channel MOS transistor $Q_3$ connected between each key output terminal and the ground and supplied at its gate with a clock signal $\phi_3$ and P-channel and N-channel MOS transistors $Q_4$ and $Q_5$ constituting an inverter 30 which receives the level at each key output terminal KO. An output stage of the key output circuit 7 is also shown in FIG. 2 and includes a P-channel MOS transistor $Q_1$ connected between the power terminal $V_{DD}$ and each key output terminal KO and supplied at its gate with a clock signal $\phi_1$ and an N-channel MOS transistor $Q_2$ connected between each key output terminal KO and the ground and supplied at its gate with a clock signal $\phi_2$. In FIG. 2, the first key output terminal $KO_0$ is represented, and therefore this terminal is connected to the power $V_{DD}$ via the resistor 16.

Figure 3:
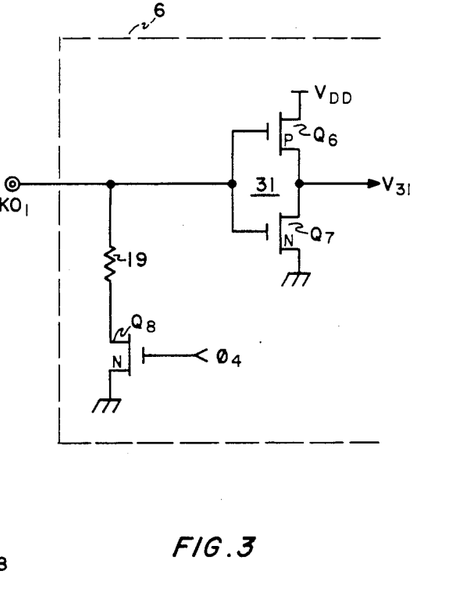
FIG. 3 is a circuit diagram showing an input stage of a key input circuit.

In FIG. 3, input stage of the key input circuit 6 is shown. Each of the key input terminals $KI_0$ to $KI_3$ is connected to the ground via a pull-down resistor 19 and an N-channel MOS transistor $Q_8$ receiving at its gate a clock signal $\phi_4$, and further connected to the gates of P-channel and N-channel MOS transistors $Q_6$ and $Q_7$. These transistors $Q_6$ and $Q_7$ are connected in series between the power terminals to constitute an inverter 31.

Figure 4:
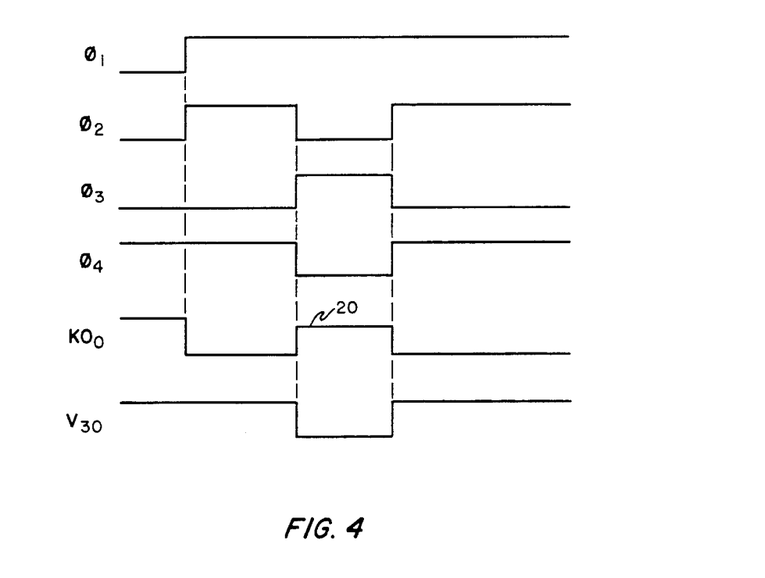
FIG. 4 is a timing chart representing a custom code read operation in the first embodiment.

The custom code read operation will be described below with reference to a timing chart shown in FIG. 4. In the standby condition, both of the clock signals $\phi_1$ and $\phi_2$ assume a low level, and hence all the key output terminals $KO_0$ to $KO_7$ take the high level. The oscillator 3 starts to oscillate by the operation of one of the key switches KS, and in response to this, the clock signals $\phi_1$ and $\phi_2$ rise to the high level. As a result, the transistors $Q_1$ and $Q_2$ are turned OFF and ON, respectively. Since the conducting resistance of the transistor $Q_2$ is selected to be sufficiently smaller than the resistors 16 to 18, all the key output terminals $KO_0$ to $KO_7$ drops to the low level. In this state, the clock signal $\phi_2$ supplied to the transistor $Q_2$ which is provided for the first key output terminal $KO_0$, is inverted into the low level as shown in FIG. 4. The gates of transistors $Q_2$ provided for the remaining key output terminals $KO_1$ to $KO_7$ are maintained at the high level. The clock signal $\phi_3$ is inverted into the low level in synchronism with the invention of the clock $\phi_2$. The inversion of the clock signal $\phi_3$ occurs only for the first key output terminal $KO_0$ and does not occur for the remaining key output terminals $KO_1$ to $KO_7$. The transistor $Q_3$ connected to the first key output terminal $KO_0$ is thus turned ON, so that the resistance-divided voltage appears at the first key output terminal $KO_0$, which is represented by a reference numeral 20 in FIG. 4 and determined by the conducting resistance of the transistor $Q_3$ and the resistor 16. At this time, if the operated key KS is disposed on the first column line e, the impedance between the first key output terminal $KO_0$ and the ground would be lowered due to the pull-down resistor 19, so that the above-mentioned resistance-divided voltage become close to the low level. The resistor 16 does not achieve its function. In order to solve this defect, the clock signal $\phi_4$ takes the low level in synchronium with the inversion of the clock signal $\phi_2$, so that the transistors $Q_8$ provided for all the key input terminals $KI_0$ to $KI_4$ are turned OFF. The pull-down resistor 19 is thereby disconnected from the ground. The resistance-divided voltage at the key output terminal $KO_0$ is determined by the resistor 16 and the conducting resistance of the transistor $Q_3$.

The conducting resistance of the transistor $Q_3$ is designed such that the resistance-divided voltage becomes larger than the logical threshold voltage of the inverter 30. Accordingly, the output voltage $V_{30}$ of the inverter 30 takes the low level as shown in FIG. 4. As a result, the level detection circuit detects that the first key output terminal $KO_0$ is connected to the power terminal $V_{DD}$ via the resistor 16 and supplies to a custom code register 10 a data "1", for example.

The clock signals $\phi_2$, $\phi_3$ and $\phi_4$ thereafter invert to the high level, the low level and the high level, respectively, so that the first key output terminal $KO_0$ and the output voltage $V_{30}$ of the inverter 30 takes the low level and the high level, respectively.

Next, the clock signal $\phi_2$ supplied to the transistor $Q_2$ provided for the second key output terminal $KO_1$ is inverted to the low level. In synchronism with this, the clock signals $\phi_3$ and $\phi_4$ are changed to the high level and the low level, respectively. There is no resistor between the second key output terminal $KO_1$ and the power terminal $V_{DD}$. Therefore, the second key output terminal $KO_1$ is held at the low level, and the output voltage $V_{30}$ of the inverter 30 is maintained at the high level. The level detection circuit 8 thereby supplies a data "0" to the custom code resistor 10.

Figure 6:
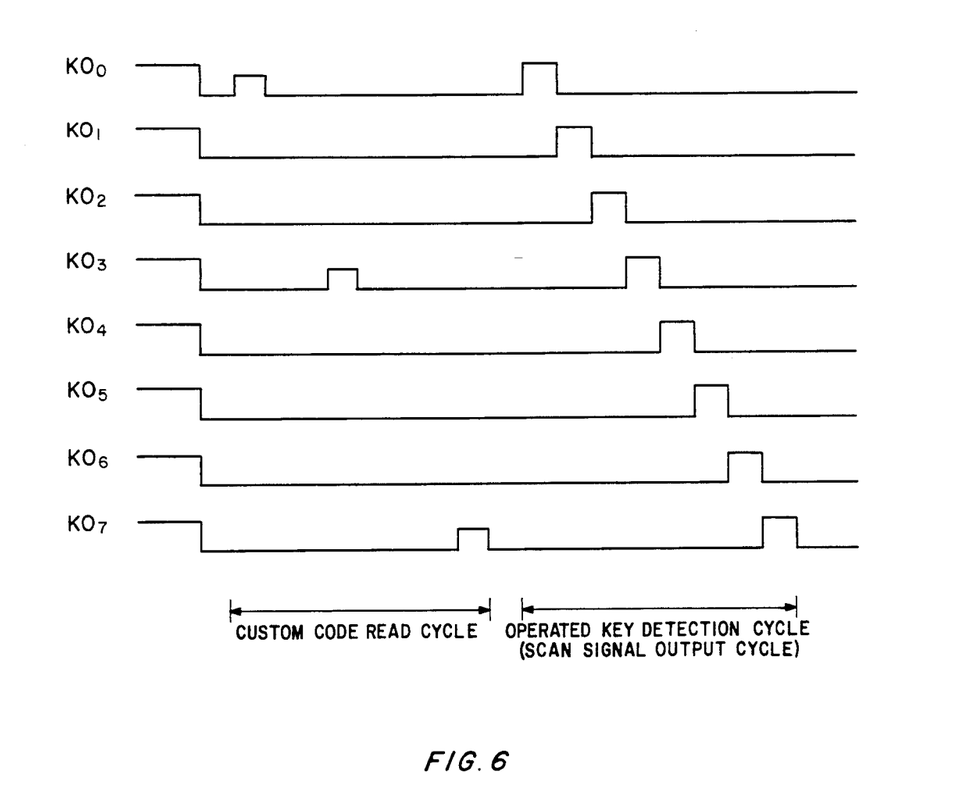
FIG. 6 is a timing chart representing a custom code read cycle and an operated key detection (a key scan) cycle in the first embodiment.

The above-mention operation is continued for the remaining key output terminals $KO_2$ to $KO_7$. As a result, the voltage exceeding the threshold voltage of the inverter 30 appears at the first, fourth and eighth key output terminals $KO_0$, $KO_3$ and $KO_7$ due to the resistors 16 to 18, as represented as a custom code read cycle in FIG. 6. The level detection circuit 8 detects the level at each key output terminal and supplies to the register 10 the data corresponding to the detected level. The register 10 thus stores data "10010001" therein at a time when the custom code read cycle is completed. The data stored in the register 10 is used as a custom code. Various custom codes can be set by changing the key output terminal KO connected to the power terminal $V_{DD}$ and/or by increasing or decreasing its number. In this embodiment, eight key output terminals are provided, and therefore $2^8$ (=256) kinds of custom codes can be set with the same type remote control IC 1.

Figure 5:
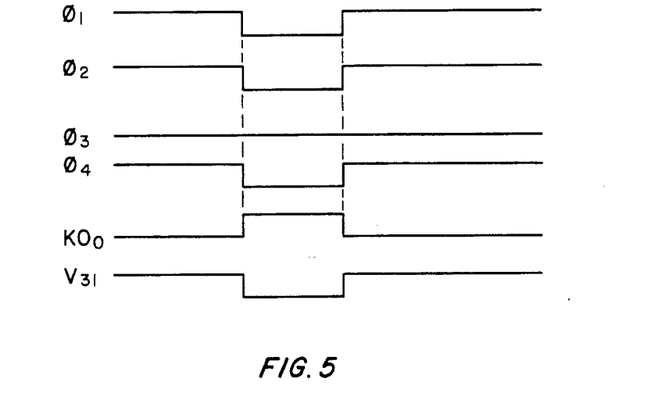
FIG. 5 is a timing chart representing a key scan operation.

When the custom code read cycle ends, the IC 1 is brought into an operated key switch detection cycle, i.e. a key scan signal output cycle. In this cycle, the clock signals $\phi_1$ and $\phi_2$ both take the low level to turn the transistors $Q_1$ and $Q_2$ ON and OFF, respectively, as shown in FIG. 5. The first key output terminal $KO_0$ is thereby raised to the high level. The remaining key output terminals $KO_1$ to $KO_7$ are held at the low level. In the operated key detection cycle, the clock signal $\phi_3$ assumes the low level to maintain the transistor $Q_3$ in the nonconducting state. The clock signals $\phi_4$ is inverted into the low level in synchronism with the clock signals $\phi_1$ and $\phi_2$ to disconnect the pull-down resistor 19 in the key input circuit 6 from the ground. The clock signal $\phi_4$ may be held at the high level, but in that case the conducting resistance of the transistor $Q_1$ is required to be sufficiently smaller than the resistor 19. If the operated key switch is one of the key switches KS disposed on the first column line e, one of the key input terminals $KI_0$ to $KI_3$ is supplied with the high level. The input terminal KI supplied with the high level depends on the operated key. As a result, the inverter 31 produces its output voltage $V_{31}$ having the low level. On the other hand, when the operated key is different from any one of the key switches KS disposed on the column line e, the output voltage $V_{31}$ of the inverter 31 does not change.

The clock signals $\phi_1$ and $\phi_2$ thereafter return to the high level, so that the first key output terminal KO is inverted to the low level.

Similar operation is carried out with respect to the remaining key output terminals $KO_1$ to $KO_7$. As a result, pulse signals are outputted from the key output terminals $KO_0$ to $KO_7$ in that order, as shown as an operated key detection cycle in FIG. 6. That is, the scan signals are outputted. The operated key is thereby detected. The key output circuit 7 includes a counter (not shown) therein, and the content thereof changes by the fact that which key output terminal KO outputs the key scan signal. Although not shown, the key input circuit 6 also includes a counter therein, and its count value varies by the fact that which key input terminal is supplied with the high level signal. The contents of these counters in the key input and output circuits 6 and 7 are employed as a key data code corresponding to the operated key switch and supplied to a key data register 9 to be stored therein. In the scan signal output circuit, the level detection circuit 8 is in the nonactivated state, and therefore the circuit 8 does not produce any its output signal.

Although not shown, it is general that the custom code read operation and the operated key detection (the scan signal output) operation are carried out twice and the custom codes and key data codes obtained in the respective cycles are then compared with each other in order to prevent an error custom code and an error key data code. Moreover, it is also general to provide a multi-push cancellation circuit in order to prevent the simultaneous pushing of two or more key switches, but such a construction is not related directly to the present invention and thus is omitted.

The custom code and key data code stored respectively in the register 9 and 10 are read-out in serial and in that order by the controller 11. The controller 11 performs the well-know Pulse-Position-Modulation (PPM) with respect to the read-out codes, and further produces the inverted codes of the custom and key data codes. The inverted codes are also subjected to the PPM. The modulated non-inverted custom code, inverted custom code, non-inverted key data code and inverted key data code are supplied in that order to an output control circuit 12. The circuit 12 is also supplied with a signal of 38 KHz which is derived from the divider 4, and this signal is superposed on the respective codes as a carrier wave. The output of the output control circuit 12 is supplied to the output terminal OUT of the IC 1 and further introduced into the drive circuit 13. The circuit 13 controls the ON and OFF states of the infrared ray diode 14 in response to the signal from the output terminal OUT. As a result, the custom code and the key data code are transmitted by means of infrared rays.

The instrument to be remote-controlled receives the command signal transmitted via the infrared rays and detects at first the custom code. The custom code thus detected is then compared with that allotted to the instrument. When coinciding with each other, the instrument introduces the key data code and then performs the corresponding operation.

As described above, the custom code for designing the instrument to be controlled is set without providing the custom code setting terminal, and further its kinds are changeable. Moreover, the resistors 16 to 18 are used for setting the custom code, and diodes which are relatively expensive, are not necessary.

In the followings, other embodiments of the present invention will be described, and in the respective embodiments, the same constituents as those shown in FIG. 1 are indicated the same numerals to omit their further explanation. In addition, the circuit operations except for the custom code read operation are the same as the first embodiment unless particular description is made, and therefore their explanations are omitted.

Figure 7:
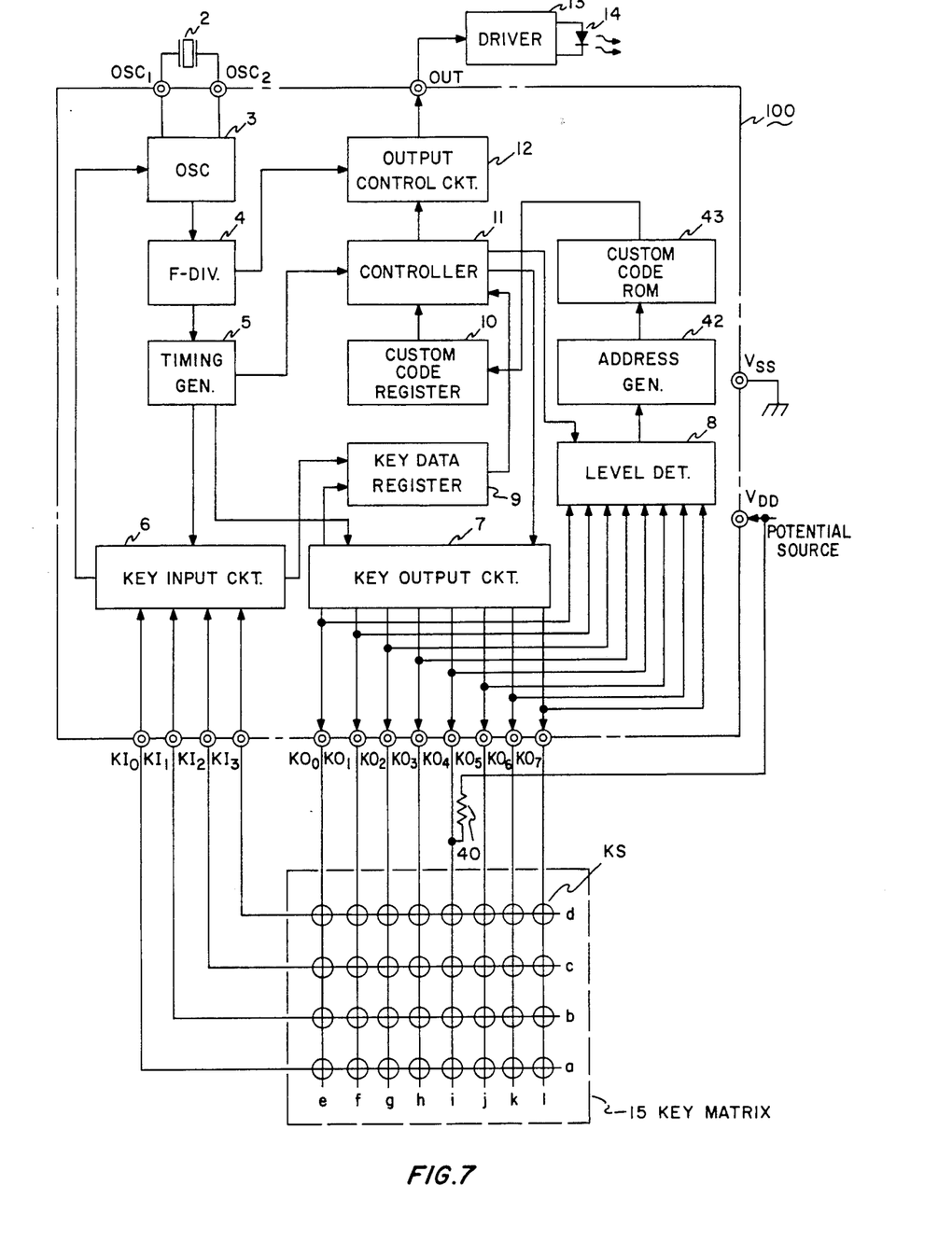
FIG. 7 is a block diagram showing a second embodiment of the present invention.

FIG. 7 shows a second embodiment of the present invention. In this embodiment, a custom code ROM (Read-Only-Memory) 43 memorizing eight kinds of custom codes is provided in a remote-control IC 100, and one of them is selected by connecting either one of eight key output terminals $KO_0$ to $KO_7$ to the power terminal $V_{DD}$ via a resistor 40. The resistor 40 is connected in this embodiment between the fifth key output terminal and the power terminal $V_{DD}$. Accordingly, as has been mentioned with reference to FIGS. 2 and 4, when the transistors $Q_2$ and $Q_3$ provided for the fifth key output terminal $KO_4$ are turned OFF and ON, respectively, the voltage exceeding the threshold level of the inverter 30 appears at that terminal $KO_4$. The level detection circuit 8 thereby produces data "1", for example. Before this and after this, the circuit 8 produces data "0". The output data of the circuit 8 are supplied to an address generator 42. The generator 42 generates an address signal responsive to the output of the circuit 8 and then supplied it to the custom code ROM 43. As a result, the custom code stored in the fifth address of the ROM 43 is read-out and then supplied to the custom code register 10.

The address varies by changing the key output terminal KO coupled to the power terminal $V_{DD}$, and the custom code stored in the register 10 is thereby changed. Also in this embodiment, the custom code setting terminal is not required. If a plurality of key output terminals are coupled to the power terminal $V_{DD}$, many kinds of address signals more than eight are generated. In accordance this, the memory capacity of the ROM can be increase to set a larger number of custom codes.

Figure 8:
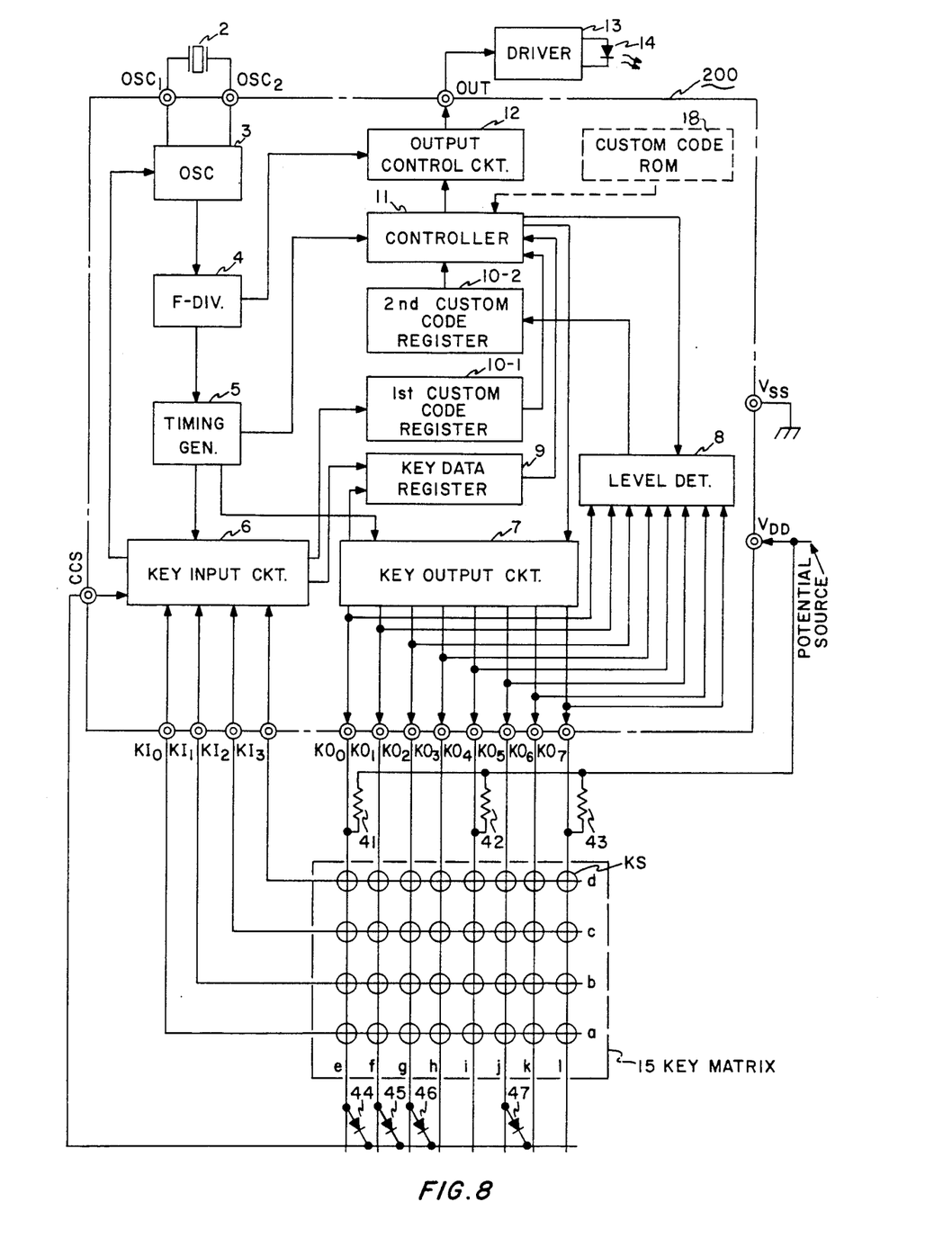
FIG. 8 is a block diagram showing a third embodiment of the present invention.

FIG. 8 shows the third embodiment of the present invention. In this embodiment, as indicating a remote-control IC by 200, a custom code setting terminal (CCS terminal) is provided on the IC 200. A selected first group of the key output terminals ($KO_0$, $KO_4$ and $KO_7$ in this embodiment) is coupled to the power terminal $V_{DD}$ via resistors 41, 42 and 43, respectively, and a selected second group of the key output terminals (in this embodiment, $KO_0$, $KO_1$, $KO_2$ and $KO_5$) is coupled to the CCS terminal via diodes 44, 45, 46 and 47, respectively. Thus, not only the customer code setting function employing the level detection circuit 8 but also that employing the CCS terminal are provided to produce an extremely large number of custom codes.

Figure 9:
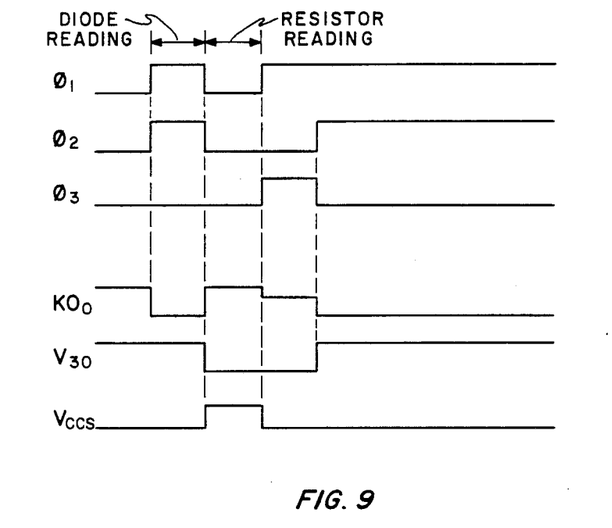
FIG. 9 is a timing chart representing a custom code read operation in the third embodiment.

For the purposes of both custom code setting functions, the output stage of the key output circuit 7 and the input stage of the key detection circuit 8 have the same circuit constructions as those of FIG. 2, but the clock signals $\phi_1$ to $\phi_3$ supplied to the respective transistors are different from those of FIG. 4, as shown in FIG. 9. More particularly, when the oscillator 3 starts to oscillate, all the key output terminals $KO_0$ to $KO_7$ take the low level, followed by the inversions of the clock signal $\phi_1$ and $\phi_2$ supplied to the transistors $Q_1$ and $Q_2$ provided for the first key output terminals $KO_0$. The transistors $Q_1$ and $Q_2$ are thereby turned ON and OFF, respectively, the first key output terminal $KO_0$ is changed to the high level. At this time, the clock signal $\phi_3$ is in the low level. In this embodiment, since the first key output terminal $KO_0$ is connected to the CCS terminal via the diode 44, the terminal CCS is supplied with the high level. The key input circuit 6 is coupled to the CCS terminal and detects the high level at that terminal to produce data "1", for example. This data is supplied to a first custom code register 10-1. If the diode 44 is not provided, the CCS terminal is in the low level, and therefore the register 10-1 receives data "0". The inverter 30 connected to the first key output terminal $KO_0$ produces the low level as its output voltage $V_{30}$, but the level detection circuit 8 rejects the output voltage $V_{30}$ by a control signal from the controller 11. As a result, it is detected whether or not the first key output terminal $KO_0$ is connected to the CCS terminal via a diode. In other words, the diode read operation is carried out when all of the clock signals $\phi_1$, $\phi_2$ and $\phi_3$ are in the low level, as shown in FIG. 9.

In order to detect whether or not the first key output terminal $KO_0$ is connected to the power terminal $V_{DD}$ via a resistor, the clock signals $\phi_1$ and $\phi_3$ are both inverted into the high level to turn the transistor $Q_1$ and $Q_3$ OFF and ON, respectively. In this embodiment, the first key output terminal $KO_0$ is connected via the resistor 41 to the power terminal $V_{DD}$. Therefore, the resistance-divided voltage determined by the resistor 41 and the conducting resistance of the transistor $Q_3$ appears at the first key output terminal $KO_0$. Since this divided voltage exceeds the threshold voltage of the inverter 30, the output voltage $V_{30}$ is held at the low level as shown in FIG. 9. The level detection circuit 8 takes up the output voltage $V_{30}$ at this time and supplies data "1" to a second custom code register 10-2. The divided voltage appearing at the terminal $KO_0$ does not make the diode 44 conductive, and hence the CCS terminal assumes the low level. The divided voltage may turn the diode 44 ON, and in that case, the key input circuit 6 is required to be in the non-activated state by another control signal from the controller 11. As a result, a resistor read-out operation is carried out.

The diode read-out operation and the resistor read-out operation are then attained with respect to the second key output terminal $KO_1$. This terminal $KO_1$ is connected to the CCS terminal via the diode 45, but no resistor is inserted between the terminals $KO_1$ and $V_{DD}$. Therefore, data "1" is stored into the first custom code register 10-1, and data "0" is stored in the second custom code register 10-2.

Figure 10:
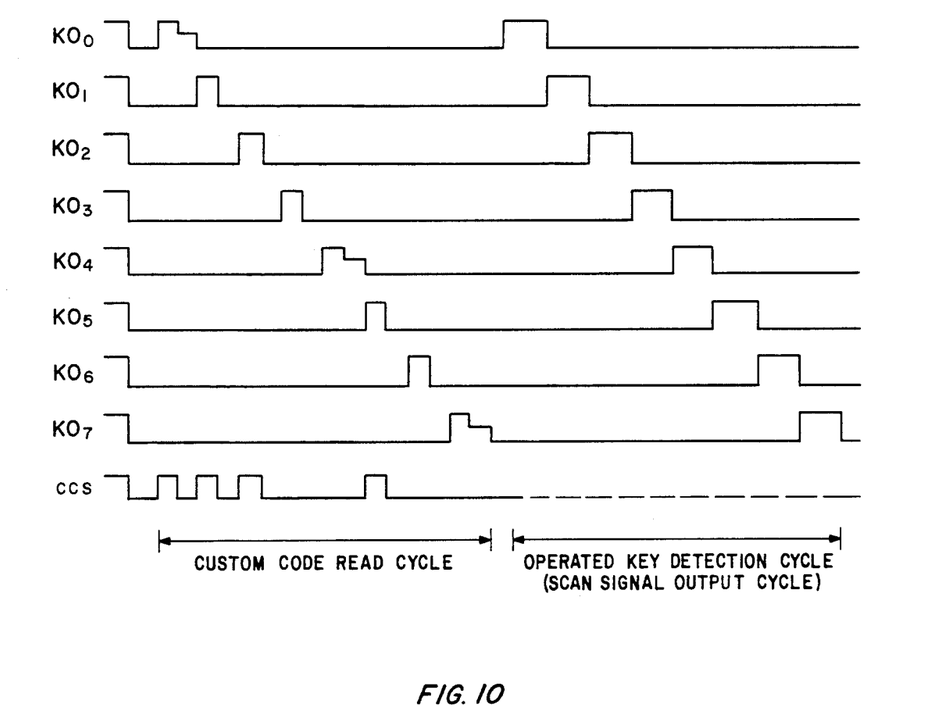
FIG. 10 is a timing chart representing a custom code read cycle and an operated key detection cycle in the third embodiment.

Thereafter, the above-mentioned operations are carried out to the eighth key output terminal $KO_7$, so that a timing chart represented as a custom code read operation in FIG. 10 is obtained. Since the diodes 44, 45, 46 and 47 is provided between the CCS terminal and the first, second, third and sixth key output terminals $KO_0$, $KO_1$, $KO_2$ and $KO_5$, respectively, the CCS terminal is supplied with the high level in sycnhronism the signal output from the those key output terminals. Since the resistors 41, 42 and 43 are present between the power terminal $V_{DD}$ and the first, fifth and eight terminals $KO_0$, $KO_4$ and $KO_7$, respectively, the divided voltage appears at those terminals. As a result, at a time when the custom code read cycle is completed, the first custom code register 10-1 stores data "11100100" therein, and the second custom code register 10-2 stores data "10001001" therein.

The operated key detection operation is thereafter carried out in a similar manner to that described with reference to the first embodiment, followed by the output of the custom and key data codes.

Figure 11A:
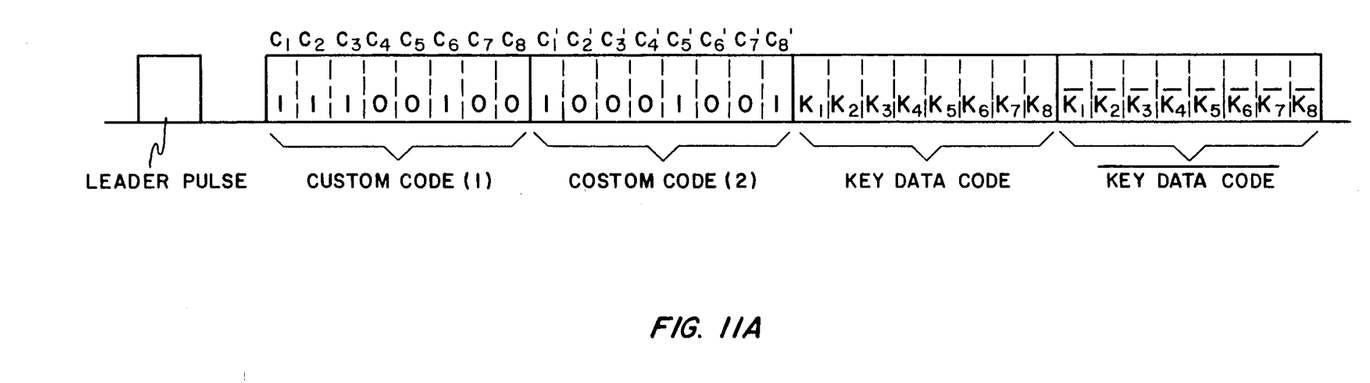
FIG. 11A is one construction diagram representative of an output code in the third embodiment and FIG. 11B is another construction diagram representative of an output code in the third embodiment.

With respect to the custom code output, the following three methods can be employed. In the first method, the data stored in the first and second custom code register 10-1 and 10-2 are outputted without any modification. That is, as shown in FIG. 11A, in the custom code composed of sixteen bits, a custom code (1) composed of $C_1$-bit to $C_8$-bit is constructed by the data "11100100" of the first register 10-1, and a custom code (2) composed of $C_1'$-bit to $C_8'$-bit is constructed by the data "10001001" of the second register 10-2. After the output of the custom code, a key code data composed of $K_1$-bit to $K_8$-bit and its inverted key code data ($\overline{K}_1$-bit to $\overline{K}_8$-bit) are outputted. In addition, before the output of the codes, a transmissionenable signal called as a leader pulse is generated.

Figure 11B:
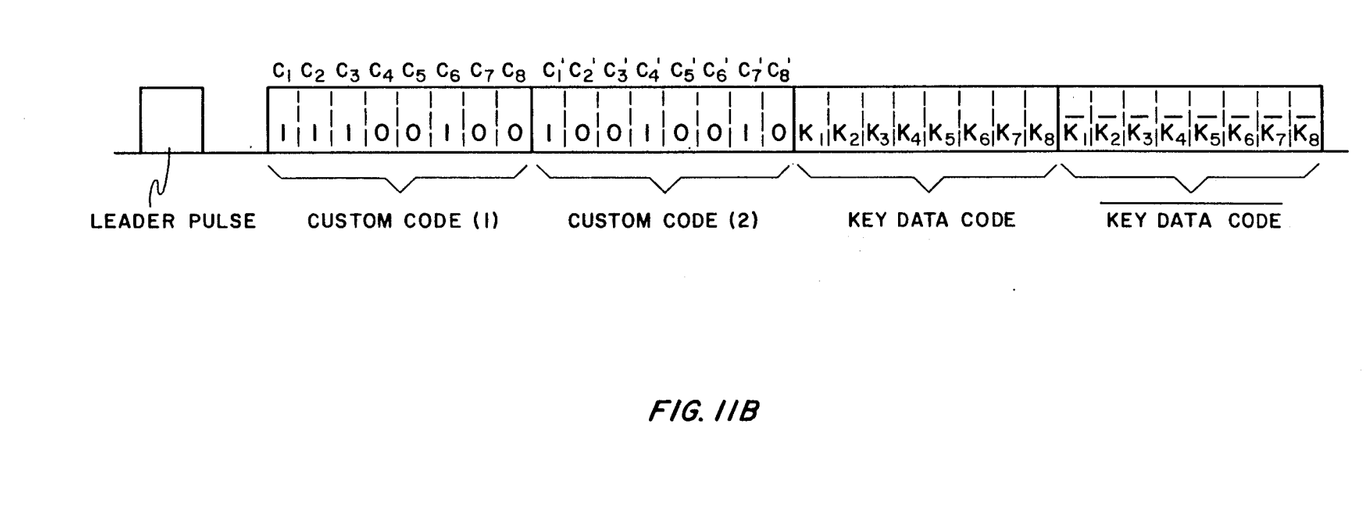

The second custom code output method is shown in FIG. 11B. The data "11100100" stored in the first register 10-1 is used as the custom code (1) composed of $C_1$-bit to $C_8$-bit. On the other hand, not only the data stored in the second register 10-2 but also that in the first register 10-1 are utilized as the customer code (2) composed of $C_1'$-bit to $C_8'$-bit. The custom code (2) is obtained by inverting the data stored in the bits in the first register 10-1 except for the bits corresponding to those in the second register 10-2 storing the data "1". Since the bits $C_1'$, $C_5'$ and $C_8'$ stores the data "1" in the second register 10-2, the data stored in the bits $C_1$, $C_5$ and $C_8$ in the first register 10-1 are not inverted and the data stored in the remaining bits are inverted. As a result, the custom code (2) takes data "10010010".

The third custom code output method is such that a custom code ROM 48 represented by a dotted line in FIG. 8 is provided in IC 200 and the data stored in the ROM 48 is utilized along with the data stored in the registers 10-1 and 10-2. The custom code ROM 48 is a sixteen bits construction and stores data "0001000101100000". The controller 11 reads out the data stored in the registers 10-1 and 10-2 as well as the data stored in the ROM 48, and obtains a first logical ORed data of the first half eight-bits data of the ROM 48 and the data of the register 10-1 and a second logical ORed data of the second half eight-bits data of the ROM 48 and the data of the register 10-2. The first and second logical ORed data are "11110101" and "11101001", respectively, in consequence. The controller 11 outputs the first logical ORed data as the custom code (1). On the other hand, the custom code (2) is obtained by inverting the data stored in the bits in the first logical ORed data except for the bits corresponding to those in the second logical ORed data storing the data "1". Accordingly, the custom codes (1) and (2) assume the data "11110101" and "11100011", respectively.

Thus, various method can be employed to output the custom code, and in every custom code output method, the number of a presettable custom codes is $2^{16} = 65536$. In other words, the signal transmitter according to this embodiment provides an extremely large kinds of custom codes by employing a remote-control IC having the same terminal number as the prior art.

The data stored in the second register 10-2 may be used as a custom code (1).

Figure 12:
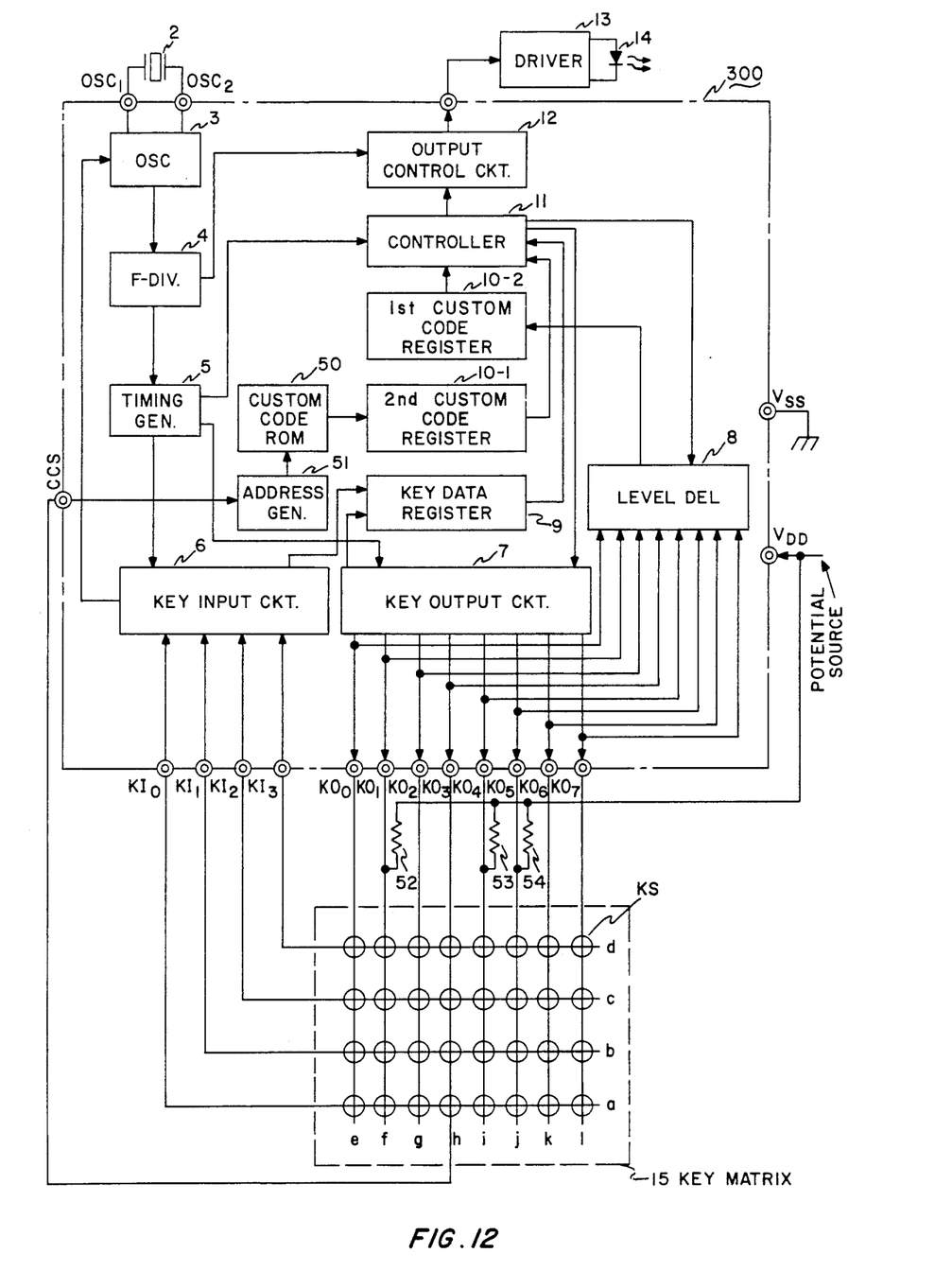
FIG. 12 is a block diagram showing a fourth embodiment of the present invention.

FIG. 12 shows a fourth embodiment of the present invention. Also in this embodiment, the custom code setting function using the CCS terminal and that using the level detection circuit 8 are provided similarly to the third embodiment, but the custom code setting function using the CCS terminal is different in its construction from that of the third embodiment. The CCS terminal is connected to only one of the first to eighth key output terminals $KO_0$ to $KO_7$ (in this embodiment, the fourth key output terminal $KO_3$). The custom code read operation is carried out similarly to the third embodiment. The second, fifth and sixth key output terminals $KO_1$, $KO_4$ and $KO_5$ are connected to the power terminal $V_{DD}$ via resistors 52, 53, and 54, respectively. Therefore, the second register 10-2 stores data "01001100" therein. On the other hand, only the fourth key output terminal $KO_3$ is connected to the CCS terminal, and therefore the CCS terminal receives the high level only when the terminal $KO_3$ is at the high level. As a result, an address generator 51 coupled to the CCS terminal generates an address signal that selects the fourth address of a custom code ROM 50. The ROM 50 memorizes eight kinds of custom codes. The data read-out from the ROM 50 is supplied to the first register 10-1.

As described above, one of eight kinds of custom codes is selected by connecting only one of the key output terminals KO to the CCS terminal, and a greater number of custom codes are further produced by the resistors 52 to 54.

Figure 13:
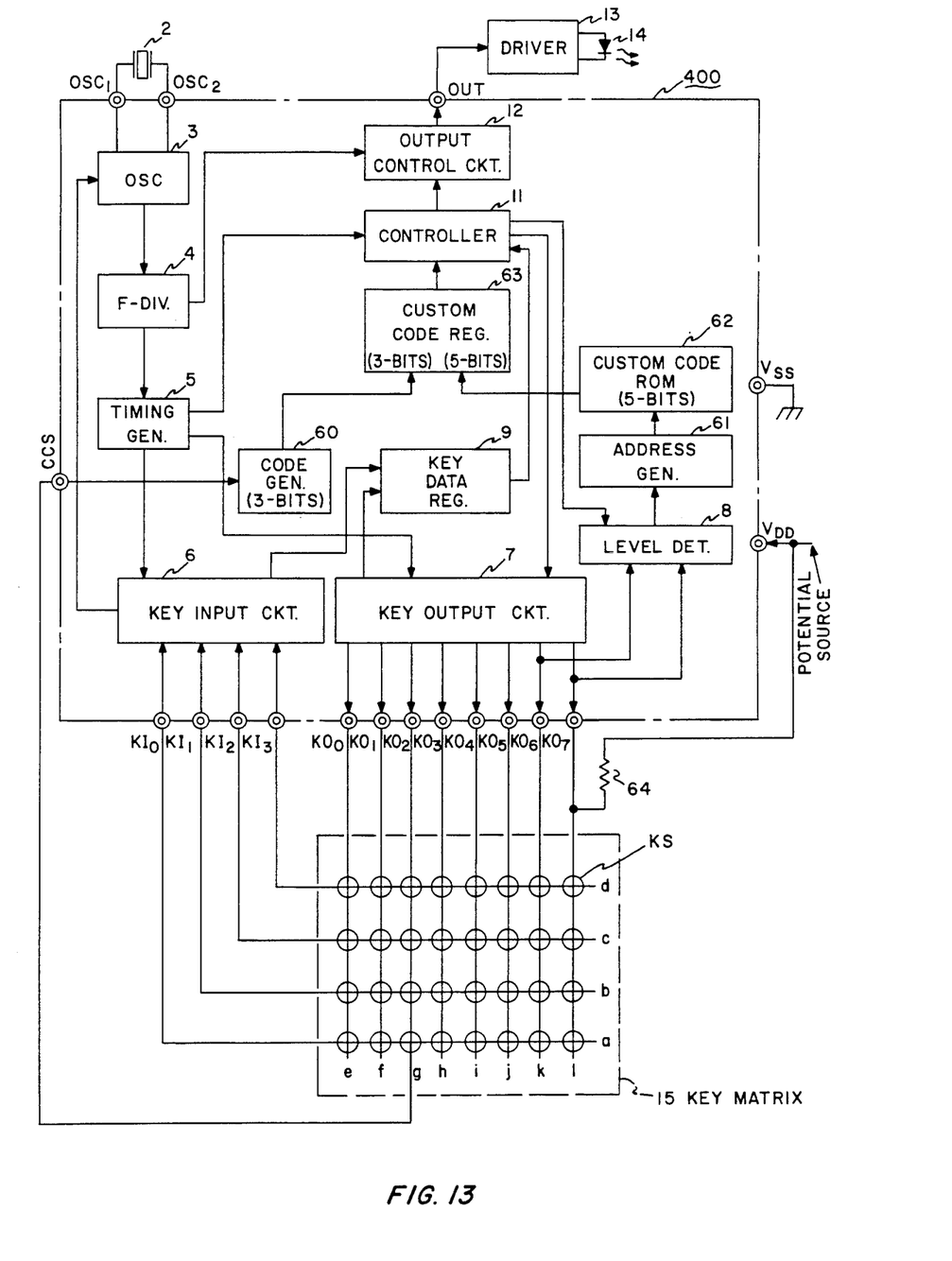
FIG. 13 is a block diagram showing a fifth embodiment of the present invention.

A fifth embodiment of the present invention is shown in FIG. 13. In this embodiment, the detection circuit 8 detects the level at the seventh and eighth key output terminals $KO_6$ and $KO_7$. The output of the circuit 8 is supplied to an address generator 61, and one address of a custom code ROM 62 is thereby selected. The ROM 62 stores four kinds of custom codes therein. Each of custom codes is a five-bits construction. Although a resistor 64 is inserted between the eighth key output terminal $KO_7$ and the power terminal $V_{DD}$, the relationship between the presence/absence of a resistor connected to the terminals $KO_6$ and $KO_7$ and the address number of the ROM 62 is represented by the following Table-1:

TABLE 1

| Resistor Coupling | | Address Number |
|---|---|---|
| $KO_6$ | $KO_7$ | of ROM 62 |
| No | No | Address 1 |
| No | Yes | Address 2 |
| Yes | No | Address 3 |
| Yes | Yes | Address 4 |

The data read-out from the ROM 62 is supplied to a custom code register 63 and stored in its latter five-bits.

On the other hand, the CCS terminal is connected either one of the first to eighth key output terminals $KO_0$ to $KO_7$, and in response to the connecting location, a code generation circuit 60 generates data composed of three-bits and represented by the following Table-2:

TABLE 2

| CCS Terminal Coupling | Data |
| --- | --- |
| $KO_0$ | 000 |
| $KO_1$ | 001 |
| $KO_2$ | 010 |
| $KO_3$ | 011 |
| $KO_4$ | 100 |
| $KO_5$ | 101 |
| $KO_6$ | 110 |
| $KO_7$ | 111 |

The three-bits data generated by the generator 60 is supplied to the register 63 and stored in its former three-bits.

As a result, the custom code register 63 storing a custom code of an eight-bits construction. The controller 11 thereafter processes the signal, as has been already mentioned.

The present invention is not limited to the aforementioned embodiments, but can be modified and changed without departing from the scope and spirit of the invention. For example, the selected key output terminal or terminals may be connected to the ground potention, and in that case all the logic level mentioned above are inverted. It is also possible to connect the selected key output terminal directly to the potential source. In this case, the conducting resistance of the transistor $Q_3$ is preferably made large in order to reduce a power consumption.

What is claimed is:

1. A signal generator comprising a plurality of key scan output terminals, means for cyclically outputting scan signals to said key scan output terminals, means for coupling a part of said key scan output terminals to a potential source to provide a potential level or levels to said part of said key scan output terminals which is different from the potential levels of the remaining key scan out terminals when said scan signals are not outputted, means coupled to each individual output terminal of all of said key scan output terminals for detecting potential levels at each individual output terminal for all of the coupled key scan output terminals to determine an output data based upon a location within the coupled key scan output terminals of said part of said key scan output terminals which has or have potential level or levels which are different from the potential levels of the remaining key scan output terminals when said scan signals are not outputted, said output data comprising a code for each said individual key output scan terminal based upon its detected potential level, and means responsive to said output data of said detecting means for generating custom code data.

2. A custom code setting circuit comprising a scan signal generator having a plurality of output terminals and cyclically generating scan signals at said output terminals, a plurality of key connection terminals coupled to a key matrix, means for connecting said key connection terminals to said output terminals of said scan signal generator, means for coupling at least one of said key connection terminals to a potential point to provide a potential level to said at least one key connection terminal which is different from the potential levels of the remaining key connection terminals when said scan signals are not outputted, means for bringing said output terminals of said scan signal generator into a high impedance state, a detector circuit means coupled directly to each individual terminal of all of said key connection terminals for detecting potential levels at each individual key connection terminal of said key connection terminals to determine an output data based upon a location within all the key connection terminals of said at least one key connection terminal which has a potential level which is different from the potential levels of the remaining key connection terminals when said output terminals of said scan signal generator are in said high impedance state, said detector circuit outputting said output data comprising a code for each individual key connection terminal based upon its detected potential level, and means responsive to said output data outputted from said detecting means for producing a custom code.

3. A custom code setting circuit comprising a scan signal generator having a plurality of output terminals and cyclically generating scan signals at said output terminals, a plurality of key connection terminals coupled to a key matrix, means for connecting said key connection terminals to said output terminals of said scan signal generator, means for coupling at least one of said key connection terminals to a potential point, means for bringing said output terminals of said scan signal generator into a high impedance state, a detector circuit means coupled to said key connection terminals in parallel with said key matrix for detecting potential levels of said key connection terminals when said output terminals of said scan signal generator are in said high impedance state, said detector circuit means outputting output data representative of the detected levels, and means responsive to said output data outputted from said detection circuit means for producing a custom code, said producing means including register means for serially receiving said output data outputted from said detector circuit means and storing said output data therein.

4. A custom code setting circuit comprising a scan signal generator having a plurality of output terminals and cyclically generating scan signals at said output terminals, a plurality of key connection terminals coupled to a key matrix, means for connecting said key connection terminals to said output terminals of said scan signal generator, means for coupling at least one of said key connection terminals to a potential point, means for bringing said output terminals of said scan signal generator into a high impedance state, a detector circuit means coupled to said key connection terminals in parallel with said key matrix for detecting potential levels of said key connection terminals when said output terminals of said scan signal generator are in said high impedance state, said detector circuit means outputting output data representative of the detected levels, and means responsive to said output data outputted from said detector circuit means for producing a custom code, said producing means including a semiconductor memory storing a plurality of custom codes, one of said custom codes being selected by said output data outputted from said detector circuit means.

5. A control signal generator comprising a plurality of key output terminals, a custom code setting terminal, a potential source, first means for coupling a first part of said key output terminals to said potential source, second means for coupling a second part of said key output terminals to said custom code setting terminal, third means coupled to said key output terminals for supplying scan signals to said key output terminals during a first period and for supplying pulse signals to said key output terminals during a second period which is different from said first period, fourth means coupled to said custom code setting terminal for receiving pulse signals produced in response to said pulse signals supplied by said third means during said second period and for detecting said second part of said key output terminals in response to the received pulse signals, fifth means responsive to a detection output of said fourth means for producing a first custom code, sixth means responsive to a level at each key output terminal for detecting said first part of said key output terminals, seventh means responsive to a detection signal of said sixth means for producing a second custom code, and eighth means responsive to said first and second custom codes for generating an output custom code.

6. The generator as claimed in claim 5, wherein said first means includes a resistor and said second means includes a diode.

7. The generator as claimed in claim 5, wherein said first means includes a resistor and said second means includes a conductive path for connecting said custom code setting terminal directly to one of said key output terminals.

8. A signal generator comprising
first and second power terminals,
an output circuit having a plurality of output nodes, a plurality of first transistors each being connected between said first power terminal and an individually associated one of said output nodes, a plurality of second transistors each being connected between said second power terminal and an individually associated one of said output nodes, means for turning OFF each pair of said first and second transistors during a code read cycle in order to bring said output nodes into a high impedance state, and means for cyclically turning ON said first transistors while turning OFF each of said second transistors during a scan signal output cycle in order to cyclically output scan signals at said output nodes,
a plurality of output terminals connected respectively to said output nodes of said output circuit,
means for connecting at least one of said output terminals to said first power terminal,
a level detector having a plurality of third transistors each being connected between said second power terminal and an individually associated one of said output terminals, means for turning ON each of said third transistors during said code read cycle and for turning OFF each of said third transistors during said scan signal output cycle, and means for detecting the different potentials between said at least one of said output terminals and each of the remaining ones of said output terminals during said code read cycle to produce a detection output, and
means responsive to the detection output of said level detector for generating code data.

9. A combination comprising a plurality of key output terminals, a plurality of key input terminals, a key matrix having a plurality of column lines connected respectively to said key output terminals, a plurality of row lines connected respectively to said key input terminals, and a plurality of keys each being disposed at a different one of intersections of said row and column lines, means coupled to said key output terminals for cyclically outputting scan signals to said key output terminals, means for connecting a part of said key output terminals to a potential source to provide a potential level or levels to said part of said key output terminals which is different from the potential levels of the remaining key output terminals when said scan signals are not outputted, means connected directly to each individual output terminal of said key output terminals for detecting potential levels at each individual output terminal for all of the connected key output terminals to determine an output data based upon a location within all the output terminals of said part of said key output terminals which have a potential level which is different from the potential levels of the remaining key output terminals when said scan signals are not outputted, said output data comprising a code for each said individual key output terminal based upon its detected potential level, and means coupled to said detecting means for outputting said output data which is representative of the different potentials between said part of said key out terminals and the remaining one or ones of said key output terminals.

10. A combination comprising a plurality of key output terminals, a scan signal output circuit for cyclically outputting scan signals to said key output terminals during a key detection cycle, said output circuit outputting no signal to said key output terminals in a code read cycle, a plurality of key input terminals, a key matrix coupled to said key output terminals and said key input terminals and having a plurality of keys, said key matrix receiving said scan signals and producing a key return signal to one of said key input terminals in response to an operation of a key, means coupled to said key input terminals and responsive to said key return signal for producing data which is representative of said key return signal, a potential source, means for connecting a part of said key output terminals to said potential source, means coupled to said key output terminals and responsive to a potential level at each of said key output terminals for detecting said part of said key output terminals in said code read cycle without utilizing said key matrix, and means responsive to a detection output of said detecting means for producing a code signal.

11. A combination comprising a signal generator having a plurality of output terminals and generating pulse signals at said output terminals during a first period, said signal generator bringing each of said output terminals into a high impedance state during a second period which is different from said first period, code setting terminals, means for connecting a first part of said output terminals to said code setting terminals, a potential source, means for connecting a second part of said output terminals to said potential source to provide a potential level or levels to said part of said output terminals which is different from the potential levels of the remaining output terminals when said scan signals are not outputted, means coupled to said code setting terminals and activated during said first period for producing a first code in response to a pulse signal or signals derived from said first part of said output terminals and arriving at said code setting terminal, and means coupled to each individual output terminal of said output terminals for detecting potential levels at each individual output terminal to determine a second code based upon a location within all the output terminals of said second part of said output terminals which have a potential level which is different from the potential levels of the remaining key output terminals and activated during said second period for producing said second code comprising a code for each said individual key output terminal based upon its detected potential level.

12. A signal generator comprising a plurality of key scan output terminals, means for cyclically outputting scan signals to said key scan output terminals, means for coupling a selected one or ones of said key scan output terminals to a potential source, and means coupled to each individual output terminal of more than two of said key scan output terminals including said selected one or ones of said key scan output terminals for detecting potential levels at each individual output terminal of all of the coupled more than two key scan output terminals, said coupling means providing a potential level or levels to said selected one or ones of said key scan output terminals which is or are different from the potential level or levels of the remaining one or ones of said coupled more than two key scan output terminals when said scan signals are not outputted to said key scan output terminals, said detecting means including means for producing an output data having a plurality of bits, each bit being representative of the detected potential level at each individual output terminal of said coupled more than two key scan output terminals when said scan signals are not outputted to said key scan output terminals.

13. This signal generator as claimed in claim 12, wherein said coupling means includes a resistor or resistors and said detecting means includes a plurality of internal resistance elements each coupled to each individual output terminal including said coupled more than two key scan output terminals, a divided voltage or voltages produced by said resistor or resistors and said internal resistance element or elements appearing at said selected one or ones of said key scan output terminals.

14. The signal generator as claimed in claim 13, wherein each of said internal resistance elements comprises a field effect transistor.

15. A combination comprising a signal generator having a plurality of output terminals and generating pulse signals at said output terminals during a first period, said signal generator bringing each of said output terminals into a high impedance state during a second period which is different from said first period, a code setting terminal, means for connecting a first part of said output terminals to said code setting terminal, a potential source, means for connecting a second part of said output terminals to said potential source, means coupled to said code setting terminal and activated during said first period for producing a first code in response to a pulse signal and arriving at said code setting terminal, means coupled to said output terminals and activated during said second period for producing a second code in response to a level or levels at said second part of said output terminals derived from said potential source and means for combining said first and second codes to produce a third code.

* * * * *